United States Patent [19]

Spurgeon

[11] Patent Number: 4,893,100
[45] Date of Patent: Jan. 9, 1990

[54] EXTERNAL MANUAL ROTATABLE DRIVE USEABLE TO TUNE A VCR

[76] Inventor: Robert L. Spurgeon, 112 W. Douglas, Fairfield, Ill. 62837

[21] Appl. No.: 124,246
[22] Filed: Nov. 24, 1987
[51] Int. Cl.$^4$ .............................................. H03J 1/12
[52] U.S. Cl. ...................................... 334/39; 334/89; 74/10.8; 74/206
[58] Field of Search ................... 74/206, 553, 10.8; 455/244; 358/191.9, 305; 334/39, 89, 7

[56] References Cited
U.S. PATENT DOCUMENTS

| | | | |
|---|---|---|---|
| 3,447,387 | 6/1969 | Berenbaum | 74/10.8 |
| 3,722,298 | 3/1973 | Tennerstedt | 74/10.8 |
| 3,906,805 | 9/1975 | Badger et al. | 334/39 X |
| 4,231,268 | 11/1980 | Osanai | 74/206 X |
| 4,439,749 | 3/1984 | Komotsu et al. | 334/89 X |
| 4,453,434 | 6/1984 | Lissy | 74/553 X |
| 4,621,539 | 11/1986 | Aoki | 74/553 |

FOREIGN PATENT DOCUMENTS 2162279 1/1986 United Kingdom .................. 74/206

Primary Examiner—Eugene R. LaRoche
Assistant Examiner—Benny Lee
Attorney, Agent, or Firm—H. Jay Spiegel

[57] ABSTRACT

Disclosed herein is a drive device designed to be detachably mounted on an existing video cassette recorder and playback machine and including a friction wheel designed to frictionally engage a channel tuning wheel already located on the machine as manufactured. The invention drive device includes a control knob constrained to rotate with the friction wheel via a shaft protruding through a housing of the device with the housing being detachably mounted on the machine with the friction wheel in frictional engagement with the existing tuning wheel.

9 Claims, 2 Drawing Sheets

EXTERNAL MANUAL ROTATABLE DRIVE USEABLE TO TUNE A VCR

BACKGROUND OF THE INVENTION

In the prior art, video cassette recording and playback machines are well known and some such machines include mechanisms enabling one to tune various desired stations through the use of an included knob in conjunction with setting of an automatic recording mechanism incorporated in the device so that one may record various programs automatically. While some more sophisticated such machines include programming devices which utilize a remote control and a display selectively displayed on the associated television monitor, most such programming devices incorporate a plurality of small tuning wheels contained within a compartment accessible through an openable closure on the device housing.

These tuning wheels are extremely small and only protrude from a surface of the housing of the device a small amount so that when it is desired to rotate one or more tuning wheels in preprogramming the device, it is sometimes difficult to frictionally engage the small surface area which is exposed on each tuning wheel. Thus a need has developed for a device which may be added to an existing video cassette recording and playback machine to facilitate the easy turning of the tuning wheels where desired.

The following patents are known to applicant: U.S. Pat. Nos. 186,304 to Brauer, 451,987 to Underwood, 1,399,329 to Vandercook, 2,613,540 to Keim, 3,089,088 to Roberts, et al., 3,285,078 to Siebold and 3,447,386 to Berenbaum, et al.

Each of the above listed United States patents teaches the concept of a drive mechanism including friction gearing. However, none of these devices discloses the concept of an add-on device designed to be installed on an existing video cassette recording and playback machine for the purpose of facilitating the easy turning of a pre-existing tuning wheel contained in the housing thereof. As such, the above listed references are believed to be of only general interest concerning the teachings of the present invention.

SUMMARY OF THE INVENTION

The present invention overcomes the deficiencies found in the prior art listed above and provides a new and improved tuning device designed to be easily added onto an existing video cassette recording and playback device to facilitate ease in tuning of a tuning wheel already contained in the housing of the machine.

The present invention includes the following interrelated aspects and features:

(a) In a first aspect, the inventive drive device includes a housing having a plurality of tabs which are specifically designed to enable the housing to be easily detachably connected to the existing housing structure of the VCR machine.

(b) Within the housing is rotatably mounted a friction wheel device having a shaft extending through the housing and having attached thereto an actuator knob.

(c) The friction wheel is so located within the housing such that when the housing is mounted on the existing VCR machine through the use of the above described tabs, the peripheral surfaces of the friction wheel will frictionally engage the tuning wheel of the VCR machine.

(d) With the inventive VCR external manual drive installed on the VCR machine with the friction wheel thereof frictionally engaging the tuning wheel of the VCR machine, rotations of the actuator knob will result in corresponding rotations of the friction wheel which, through the frictional engagement with the tuning wheel, will cause corresponding movements of the tuning wheel to thereby facilitate the tuning of stations for automatic recording on the VCR machine as desired.

(e) Through the use of the present invention, setting of VCR tuning wheels is made much easier and less cumbersome than : is the case when the tuning wheels must be engaged with a finger.

Accordingly, it is the first object of the present invention to provide an improved VCR external manual drive.

It is a further object of the present invention to provide an improved VCR external manual drive which includes a housing detachably mountable on the existing VCR housing.

It is a still further object of the present invention to provide such a drive device with a friction wheel designed to frictionally engage a tuning wheel of the VCR machine to facilitate easy tuning of the tuning wheel as desired.

These and other objects, aspects and features of the present invention will be better understood from the following detailed description of the preferred embodiment when read in conjunction with the appended drawing figures.

SPECIFIC DESCRIPTION OF THE PREFERRED EMBODIMENT

Figure 1:
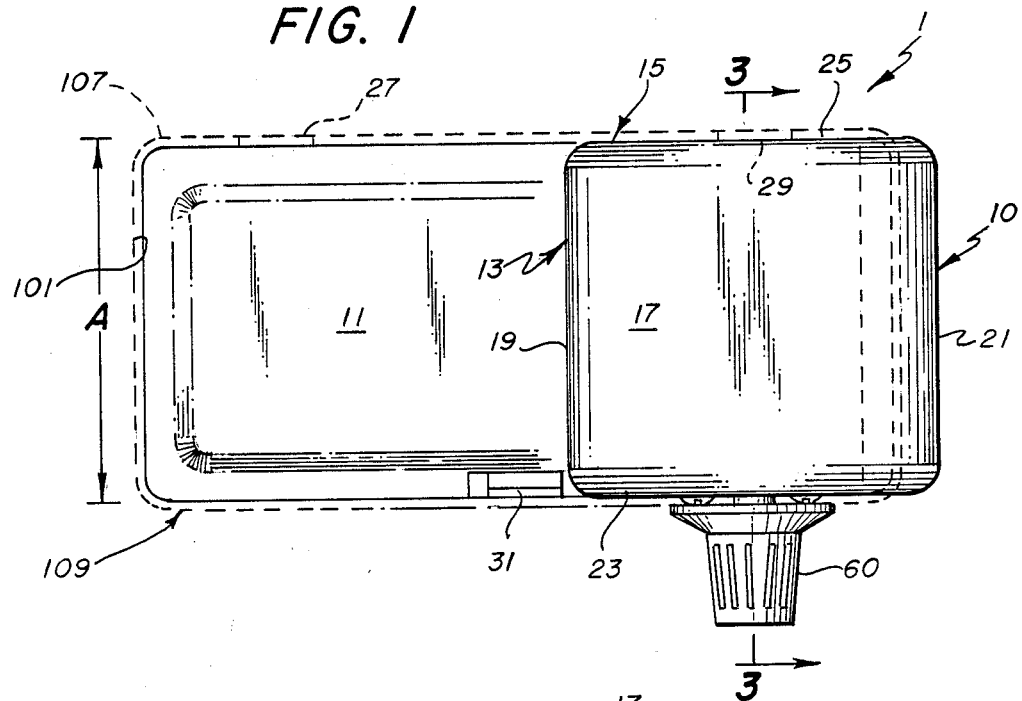
FIG. 1 shows a top view of the present invention.
Figure 2:
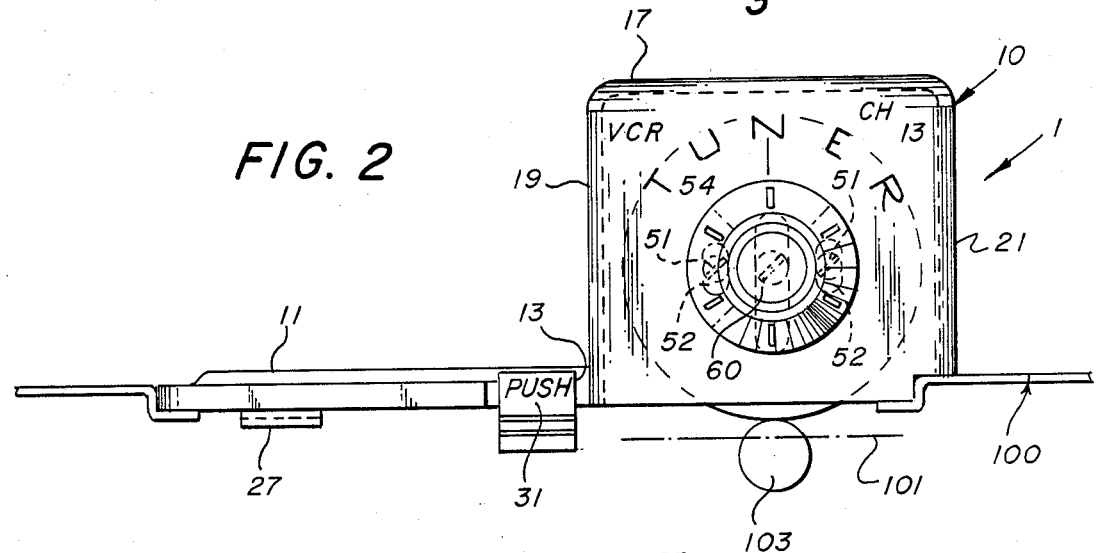
FIG. 2 shows a front view of the present invention.

Reference is first made to FIGS. 1 and 2 wherein the inventive manual drive device is generally designated by the reference numeral 1. The device includes a housing 10 of stepped configuration having a low stepped portion 11 connected at a shoulder 13 with a rectangular cubic housing portion 15 having a top 17, sides 19, 21, front 23 and back 25.

Figure 5:
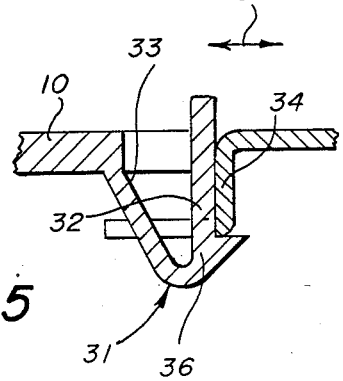
FIG. 5 shows a side view of a tab also shown in FIGS. 1 and 2.

As best seen in FIG. 1, the housing includes two mounting tabs 27, 29, on a back wall of the housing 10 which are substantially rigid, and a front tab 31 which, as best seen in FIG. 5, is connected to the housing 10 by a thin arm 33 facilitating flexing of the tab 31 in the direction of the arrow 35.

Figure 3:
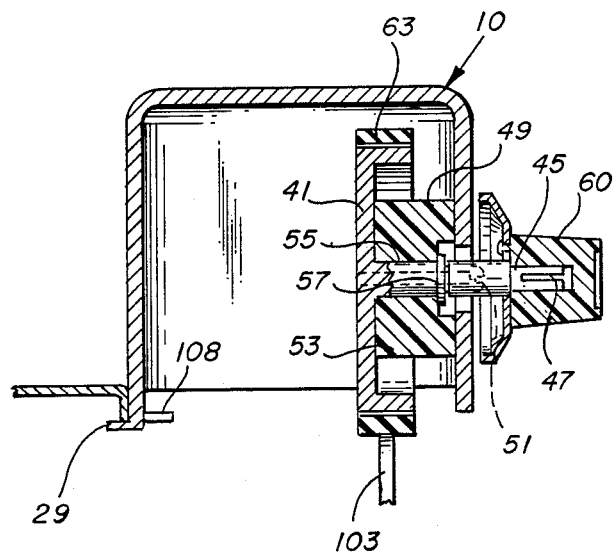
FIG. 3 shows a cross-sectional view along the line 3—3 of FIG. 1.
Figure 6:
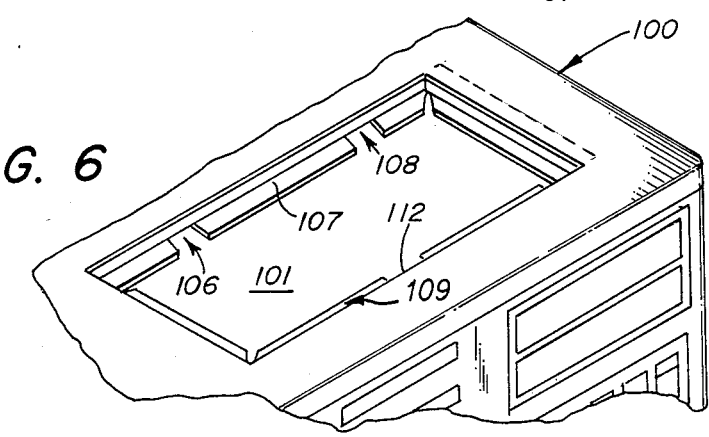
FIG. 6 shows a perspective view of a typical VCR machine showing the structure to which the present invention is adapted.

With reference to FIGS. 2, 3 and 6, it is seen that the existing VCR 100 includes a surface 101 through which projects a small portion of the periphery of a tuning wheel 103 which may be selectively rotated to facilitate tuning of a programming device of the VCR. As seen in FIG. 1, the surface 101 on the VCR 100 has a width A from front to back which corresponds to the width of the walls 19 and 21 and of the device 1. As should be understood, (FIG. 6) above the rear wall defining the extent of the surface 101, a projecting surface 107 is formed having cut-out slots 106, 108 and at the front wall of a further projecting surface 109 is formed having a cut-out slot 112. As should be understood from FIG. 5, the tab 31 includes a protrusion 36 provided so that when the housing 10 is to be installed on the surface 101, the tabs 27 and 19 are first inserted beyond and under the respective slots 106 and 108 whereupon the tab 31 is flexed in the left-hand direction-in FIG. 5 so that the housing 10 may be pivoted to a position where release of pressure on the tab 31 will result in the protrusion 36 extending beyond and underlying the slot 112 as best seen in FIG. 5 to assemble the housing 10 fixedly on the surface 101. The area 108 is best seen in FIG. 3.

Figure 4:
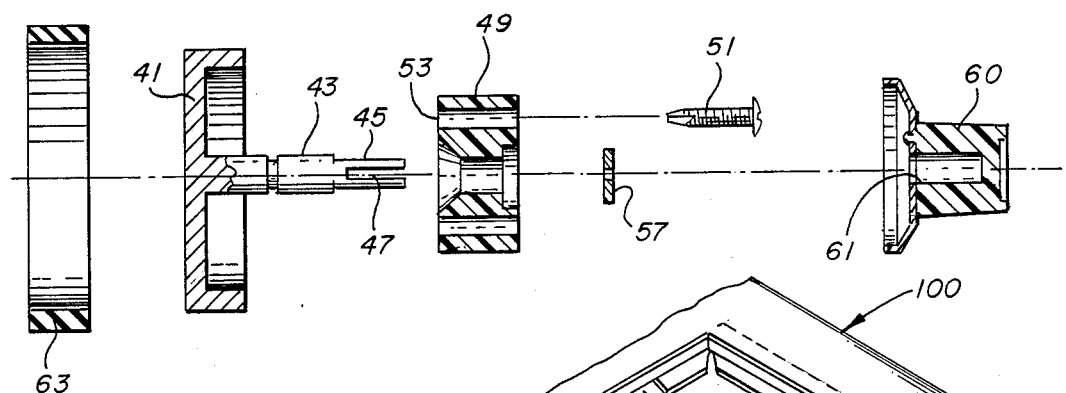
FIG. 4 shows an exploded cross-sectional view of the friction wheel drive mechanism of the present invention.

With reference now to FIGS. 3 and 4, it is seen that the friction wheel drive aspect of the present invention includes a wheel 41 having attached thereto an elongated shaft 43 having at its end a knob receiving portion 45 having a slot 47 therein.

The housing 10 has a hub and spacer device 49 removably mounted on an inner surface thereof through the use of screws 51 threadably received in openings 53 formed in the device 49. The shaft 43 is bearingly received through an opening 55 formed through the device 49 and split ring 57 maintains the position of the wheel 41 with respect to the housing 10. The shaft 43 has mounted on its opposite end an actuator knob 60 having an opening 61 therein designed to frictionally engage the end 45 of the shaft 43 so the rotations of the knob 60 will result in corresponding rotations of the wheel 41. As best seen in FIG. 2, the screws 51 extend through slots 52 in the wall 23 which allow vertical adjustment of the position of wheel 41. The shaft 43 extends through slot 54 in wall 23 to allow such vertical adjustment.

Mounted about the periphery of the wheel 41 is a friction ring 63 which may be made of any gripping material such as, for example, rubber. The ring is attached to the periphery of the wheel 41 by any suitable means such as, for example, adhesive. The ring 63 is sufficiently resilient that it may be compressed when pressure is applied thereto.

As seen in FIG. 3, with the housing 10 installed on the surface 101 as explained hereinabove, the ring 63 is in frictional engagement with the tuning wheel 103 pre-existing in the VCR machine. As should clearly be understood from FIG. 3, rotation of the knob 60 will result in corresponding rotations of the wheel 41 and ring 63, thereby resulting in rotations of the tuning wheel 103. As best understood from FIG. 2, the diameter of the ring 63 as mounted on the wheel 41 is significantly greater than the diameter of the tuning wheel 103. Thus, rotation of the knob 60 through one revolution will result in several revolutions of the tuning wheel 103. In the example shown in the figures, the diameter of the ring 63 is approximately five times the diameter of the tuning wheel 103 and accordingly, in the example shown, rotation of the knob 60 through one revolution will result in approximately five revolutions of the tuning wheel 103. As such, it should be understood that through slow rotations of the knob 60, the tuning wheel 103 may be rotated a greater speed resulting in quick tuning of the tuning wheel to the desired stations.

If desired, indicia may be printed on the face 23 of the housing 10 to indicate which station has been tuned by a particular degree of rotation of the knob 60. In this way, easy and accurate tuning of the tuning wheel 103 may be had without the necessity of using a finger on a small tuning wheel, only a small portion of which is exposed Of course, the inventive device 1 may easily be adapted to other structural situations in existing VCR machines. Thus, the tabs 27, 29 and 31 may be designed in whatever way is necessary to adapt them to the particular structural situation wherein it is desired to mount a device such as a device 1. In fact, other structure may be utilized to detachably attach the device 10 in place such as, for example, hook and pile fastening means, magnetic attachment devices, adhesive, screws or any other well known fastening device.

In the preferred embodiment, the ring 63 is made of a material exhibiting good frictional characteristics such as soft neoprene rubber. The hub and spacer device 49 may be made of any material which exhibits great structural integrity while providing good bearing characteristics. Polytetrafluoroethylene is an example of a material which has suitable characteristics for this application. Furthermore, the housing 10 may be made of any desired material such as molded plastic, sheet metal or other easily fabricated material.

Accordingly, an invention has been disclosed in terms of a preferred embodiment thereof which fulfills each and every one of the objects set forth hereinabove and provides a new and improved VCR external manual drive which provides ease of actuation of tuning wheels which are found on an existing VCR machine. Of course, various changes, modifications and alterations in the teachings thereof may be contemplated by those skilled in the art without departing from the intended spirit and scope of the present invention. Accordingly, it is intended that the present invention only be limited by the terms of the appended claims.

I claim:

1. In a first device having a first housing with a first surface, said first surface having a first slot therein with a first rotary wheel protruding partially therethrough and second and third opposed elongated slots adjacent said first surface, an actuator detachably mountable on said first device and including:
   (a) a second housing including a bottom surface and an upstanding wall with an opening therethrough;
   (b) connection means on said bottom surface for releasably attaching said second housing to said first surface, said connection means comprising opposed tabs releasably engageable in said second and third slots, respectively;
   (c) a friction wheel with an actuator shaft protruding through said opening;
   (d) said first rotary wheel having a first peripheral surface which is frictionally engaged by a second peripheral surface on said friction wheel when said connector means attaches said second housing to said first surface, whereby rotation of said actuator shaft results in rotation of said friction wheel and first rotary wheel.

2. The invention of claim 1, wherein said tabs comprise a first fixed tab and a second tab connected to said bottom surface via a flexible arm allowing slight movement of said second tab against resilient bias of said flexible arm.

3. The invention of claim 1, wherein said second housing includes a chamber formed by walls, including said upstanding wall, said friction wheel being contained within said chamber.

4. The invention of claim 1, further including a hub attached to said upstanding wall with a further opening therethrough in alignment with said upstanding wall opening, said actuator shaft being bearingly received through said further opening, and an actuator knob releasably attached to said actuator shaft at an end thereof remote from said friction wheel.

5. The invention of claim 1, wherein said friction wheel comprises a second rotary wheel, and further wherein a flexible ring is mounted on a peripheral surface of said second rotary wheel for rotation therewith.

6. The invention of claim 5, wherein said flexible ring comprises a band of rubber.

7. The invention of claim 5, wherein said actuator shaft is integrally formed with said second rotary wheel.

8. The invention of claim 1, wherein said first device comprises a video cassette recording and playback machine.

9. The invention claim 9, wherein said first rotary wheel comprises a station tuning wheel.

* * * * *